United States Patent
Liu et al.

(10) Patent No.: US 11,493,435 B2
(45) Date of Patent: Nov. 8, 2022

(54) ARRAY SUBSTRATE AND MICRO TOTAL ANALYSIS DEVICE

(71) Applicant: BOE Technology Group Co., Ltd., Beijing (CN)

(72) Inventors: Yingming Liu, Beijing (CN); Xue Dong, Beijing (CN); Haisheng Wang, Beijing (CN); Xiaochuan Chen, Beijing (CN); Xiaoliang Ding, Beijing (CN); Lei Wang, Beijing (CN); Changfeng Li, Beijing (CN); Pinchao Gu, Beijing (CN); Ping Zhang, Beijing (CN); Xueyou Cao, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 169 days.

(21) Appl. No.: 16/766,774

(22) PCT Filed: Dec. 11, 2019

(86) PCT No.: PCT/CN2019/124688
§ 371 (c)(1),
(2) Date: May 26, 2020

(87) PCT Pub. No.: WO2020/140714
PCT Pub. Date: Jul. 9, 2020

(65) Prior Publication Data
US 2021/0215596 A1 Jul. 15, 2021

(30) Foreign Application Priority Data

Jan. 2, 2019 (CN) .......................... 201910002555.2

(51) Int. Cl.
*G01N 21/25* (2006.01)
*G01N 21/27* (2006.01)
(Continued)

(52) U.S. Cl.
CPC .......... *G01N 21/255* (2013.01); *G01N 21/27* (2013.01); *G02F 1/13624* (2013.01);
(Continued)

(58) Field of Classification Search
CPC ............. H01L 27/1222; H01L 27/3262; G02F 1/13624
See application file for complete search history.

(56) References Cited

U.S. PATENT DOCUMENTS

2015/0123137 A1* 5/2015 Kwon ................. H01L 27/1218
257/72
2015/0249098 A1 9/2015 Zhang et al.
(Continued)

FOREIGN PATENT DOCUMENTS

CN 103296022 A 9/2013
CN 103838048 A 6/2014
(Continued)

OTHER PUBLICATIONS

Chinese Office Action dated Jun. 23, 2020 in related Chinese Application No. 201910002555.2.

*Primary Examiner* — Peter M Albrecht
(74) *Attorney, Agent, or Firm* — ArentFox Schiff LLP; Michael Fainberg

(57) ABSTRACT

The present disclosure discloses an array substrate and a micro total analysis device. The array substrate includes: a substrate, a plurality of pixel regions arranged on the substrate and defined by the intersection of a plurality of data lines and a plurality of gate lines, and a plurality of drive transistors arranged in the plurality of pixel regions respectively; each drive transistor includes a first active layer pattern, a first extension direction of the first active layer
(Continued)

pattern forms a first preset angle with a gate line, and in a first preset angle direction, the first active layer pattern spans a pixel region in an inclined manner; and source and drain electrodes of the each drive transistor are coupled with the active layer pattern in the first preset angle direction.

11 Claims, 7 Drawing Sheets

(51) Int. Cl.
*H01L 27/12* (2006.01)
*H01L 27/32* (2006.01)
*G02F 1/1362* (2006.01)

(52) U.S. Cl.
CPC ...... *H01L 27/1222* (2013.01); *H01L 27/3262* (2013.01); *H01L 27/124* (2013.01)

(56) References Cited

U.S. PATENT DOCUMENTS

| | | | |
|---|---|---|---|
| 2016/0011705 A1* | 1/2016 | Huang | G02F 1/13338 345/174 |
| 2017/0125529 A1 | 5/2017 | Lin et al. | |
| 2017/0293172 A1 | 10/2017 | Zhang | |
| 2020/0061608 A1 | 2/2020 | Liu et al. | |
| 2020/0108387 A1 | 4/2020 | Dong et al. | |

FOREIGN PATENT DOCUMENTS

| | | |
|---|---|---|
| CN | 104465673 A | 3/2015 |
| CN | 104538402 A | 4/2015 |
| CN | 106684101 A | 5/2017 |
| CN | 106959558 A | 7/2017 |
| CN | 107607475 A | 1/2018 |
| CN | 108816299 A | 11/2018 |
| CN | 109659326 A | 4/2019 |
| JP | 2009122305 A * | 6/2009 |

* cited by examiner

ARRAY SUBSTRATE AND MICRO TOTAL ANALYSIS DEVICE

CROSS REFERENCE TO RELATED APPLICATIONS

The present application is a National Stage of International Application No. PCT/CN2019/124688, filed Dec. 11, 2019, which claims the priority to Chinese patent application No. 201910002555.2, filed with Chinese Patent Office on Jan. 2, 2019, and entitled "Array Substrate and Micro Total Analysis Device", the contents of which are incorporated by reference herein in its entirety.

FIELD

The present disclosure relates to the field of detection technology, in particular to an array substrate and a micro total analysis device.

BACKGROUND

The conduction capability of a transistor in an array substrate directly influences the accuracy of data transmission. Especially, along with an increase of the drive voltage, the stability of the transistor will be greatly influenced. That is, along with an increase of the drive voltage, the threshold voltage and characteristics of the transistor will become very poor, thereby influencing the conduction characteristics of the transistor.

SUMMARY

An embodiment of the present disclosure provides an array substrate, including: a substrate; a plurality of data lines and a plurality of gate lines, arranged on the substrate and intersected to define a plurality of pixel regions; a plurality of drive transistors, arranged in the plurality of pixel regions respectively; wherein each drive transistor includes a first active layer pattern, a first extension direction of the first active layer pattern forms a first preset angle with a gate line adjacent to the each drive transistor, and in a first preset angle direction, the first active layer pattern spans a pixel region corresponding to the each drive transistor in an inclined manner; and source and drain electrodes of the each drive transistor are coupled with two ends, in the first preset angle direction, of the first active layer pattern.

In one possible implementation, in the above array substrate provided in an embodiment of the present disclosure, the pixel region is a quadrangle, and the first extension direction of the first active layer pattern is the same as a diagonal direction of the pixel region; and a distance between the first active layer pattern and the diagonal satisfies a preset threshold.

In one possible implementation, in the above array substrate provided in an embodiment of the present disclosure, the first active layer pattern extends along the diagonal direction of the pixel region.

In one possible implementation, in the above array substrate provided in an embodiment of the present disclosure, the pixel region is a rectangle.

In one possible implementation, in the above array substrate provided in an embodiment of the present disclosure, the pixel region is a parallelogram, and the first active layer pattern extends along a long diagonal direction of the parallelogram.

In one possible implementation, in the above array substrate provided in an embodiment of the present disclosure, a plurality of induction transistors arranged in the plurality of pixel regions respectively is further included; a second extension direction of a second active layer pattern of each induction transistor forms a second preset angle with a gate line adjacent to the each induction transistor, and in a second preset angle direction, the second active layer pattern of the each induction transistor spans a pixel region corresponding to the each induction transistor in the inclined manner; source and drain electrodes of the each induction transistor are coupled with two ends, at the second preset angle direction, of the second active layer pattern.

In one possible implementation, in the above array substrate provided in an embodiment of the present disclosure, the second extension direction of the second active layer pattern of the each induction transistor is in parallel with the first extension direction of the first active layer pattern of the each drive transistor, and a first orthographic projection of the first active layer pattern on the substrate and a second orthographic projection of the second active layer pattern on the substrate do not overlap with each other.

In one possible implementation, in the above array substrate provided in an embodiment of the present disclosure, a second length of the second active layer pattern of the each induction transistor is smaller than a first length of the first active layer pattern of the each drive transistor.

In one possible implementation, in the above array substrate provided in an embodiment of the present disclosure, a photosensitive device arranged in the pixel region is further included, and the photosensitive device is electrically coupled with one of the source and drain electrodes of the each induction transistor; a third orthographic projection of the photosensitive device on the substrate and a fourth orthographic projection of the each drive transistor on the substrate do not overlap with each other.

In one possible implementation, in the above array substrate provided in an embodiment of the present disclosure, a transparent drive electrode arranged in the pixel region is further included, and the transparent drive electrode is electrically coupled with one of the source and drain electrodes of the each drive transistor; and the transparent drive electrode is arranged on a side, deviating from the substrate, of the photosensitive device, and a fifth orthographic projection of the transparent drive electrode on the substrate covers the third orthographic projection of the photosensitive device on the substrate.

Correspondingly, an embodiment of the present disclosure further provides a micro total analysis device, including the array substrate of any of the above embodiments.

In one possible implementation, in the micro total analysis device provided in an embodiment of the present disclosure, an optical waveguide arranged opposite to the array substrate is further included, and a space for accommodating to-be-analyzed objects is arranged between the array substrate and the optical waveguide.

DETAILED DESCRIPTION OF THE EMBODIMENTS

In the related art, through increasing the length-width ratio of an active layer pattern of a transistor, the stability of the transistor can be improved, therefore, the conduction characteristics of the transistor can be ensured to be not influenced when the drive voltage is increased, however, when the length-width ratio of the active layer pattern of the transistor is increased, a larger area of the pixel region will be occupied, thereby leading to reduced number of the pixels, and being unbeneficial for the high pixel design.

Figure 1:
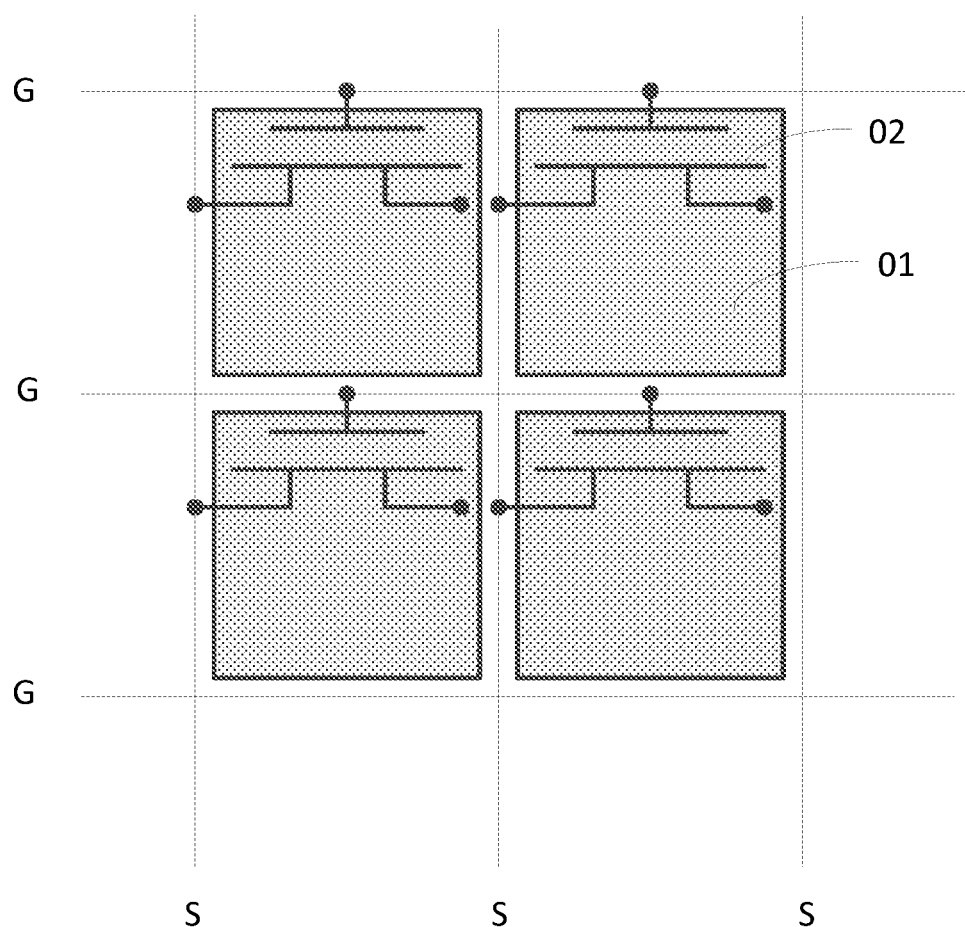
FIG. 1 is a structural schematic diagram of a relative position of a drive transistor in a pixel region in the related art.

Specifically, as shown in FIG. 1, an array substrate in the related art includes a plurality of transistors arranged in multiple pixel regions respectively. A gate of each transistor is coupled with a corresponding gate line G, a first electrode of the each transistor is coupled with a corresponding data line S, a second electrode of the each transistor is coupled with a drive electrode 01, and an extension direction of an active layer pattern 02 is set to be in parallel with the corresponding gate line G. The active layer pattern between the first electrode and the second electrode of the each transistor is deemed as a channel region of the transistor, and the length of the channel region can be deemed as the length of the active layer pattern between the first electrode and the second electrode, i.e., the length of the active layer pattern in an extension direction. To improve the stability of the transistor driven under high voltage, the length of the source layer pattern 02 in the extension direction needs to be increased, if the length of the source layer pattern 02 in the extension direction is increased, the area occupied by the pixel region will also be increased, thereby reducing the number of pixels arranged on the substrate, and being unbeneficial for the high pixel design.

Therefore, how to increase the length-width ratio of a channel of the transistor without changing the area of the pixel region is the technical problem to be urgently solved by those skilled in the art.

For the problem in the related art that high pixel design cannot be realized due to an increased length-width ratio of the channel of the transistor, the embodiments of the present disclosure provide an array substrate and a micro total analysis device.

In order to make the objects, technical solutions, and advantages of the present disclosure more apparent, the present disclosure will be described below in further details with reference to the drawings, and apparently the embodiments described below are only a part but not all of the embodiments of the present disclosure. Based upon the embodiments of the present disclosure, all the other embodiments which can occur to those skilled in the art without any inventive effort shall fall into the protection scope of the present disclosure.

The shape and size of each part in the drawings do not reflect true proportions, merely aiming at schematically illustrating the content of the present disclosure.

Figure 2:
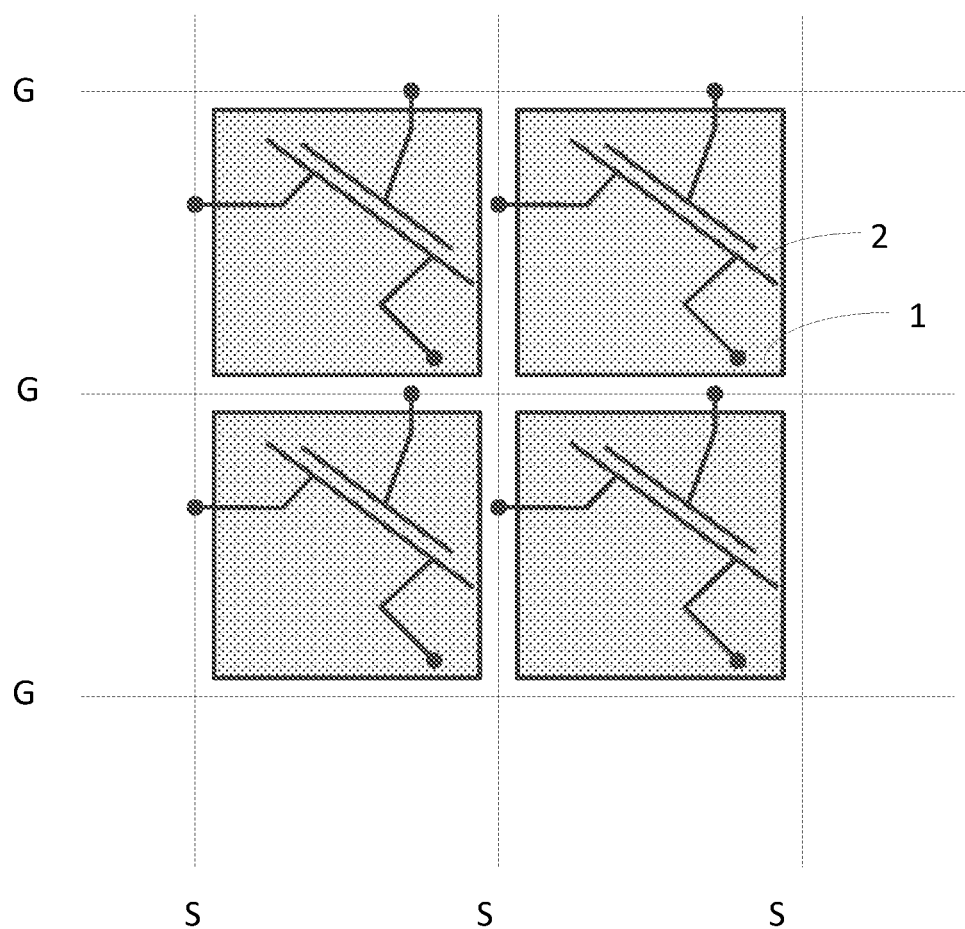
FIG. 2 is a structural schematic diagram of a relative position of a drive transistor in a pixel region provided in an embodiment of the present disclosure.

Specifically, as shown in FIG. 2, the present disclosure provides an array substrate. The array substrate includes: a substrate, a plurality of pixel regions arranged on the substrate and defined by the intersection of multiple data lines S and multiple gate lines G, and a plurality of drive transistors arranged in the plurality of pixel regions. A gate of each drive transistor is coupled with a corresponding gate line G, a first electrode (i.e., the source) is coupled with a corresponding data line S, and a second electrode (i.e., the drain) is coupled with a corresponding drive electrode 1. The drive electrode 1 is located on a side, deviating from the substrate, of the drive transistor. The drive electrode 1 is a metal drive electrode or a transparent drive electrode according to different application scenarios, which is not specifically defined herein.

The drive transistor includes a first active layer pattern 2. An first extension direction of the first active layer pattern 2 forms a first preset angle with a gate line G adjacent to the each drive transistor, and in a first preset angle direction, the first active layer pattern 2 spans a pixel region corresponding to the each drive transistor in an inclined manner, which can be deemed that the active layer pattern 2 penetrates through the pixel region in the first preset angle direction. In this way, when the area of the pixel region is fixed, the length of the active layer pattern in the first preset angle direction is larger than the length of the active layer pattern in the related art when the extension direction of the active layer pattern is in parallel with the gate line, specifically, according to different shapes of the pixel region, the ranges of the first preset angle will be different, which is not specifically defined herein.

The source and drain electrodes of the drive transistor are coupled with two ends, in the first preset angle direction, of the first active layer pattern 2, such that the length of the channel region of the drive transistor is approximately equal to the length of the active layer pattern between the source and drain electrodes in the first preset angle direction.

Specifically, in the array substrate provided in an embodiment of the present disclosure, the first extension direction of the first active layer pattern 2 is set to form a first preset angle with the gate line G, compared with the manner in which the extension direction of the active layer is set to be in parallel with the gate line G, the length of the first active layer pattern 2 in the extension direction can be increased, therefore, not only the length-width ratio of a channel of the drive transistor is increased, but also the area occupied in the pixel region is not increased, thereby being beneficial for realizing high pixel design while increasing the conduction characteristics of the drive transistor.

Figure 3:
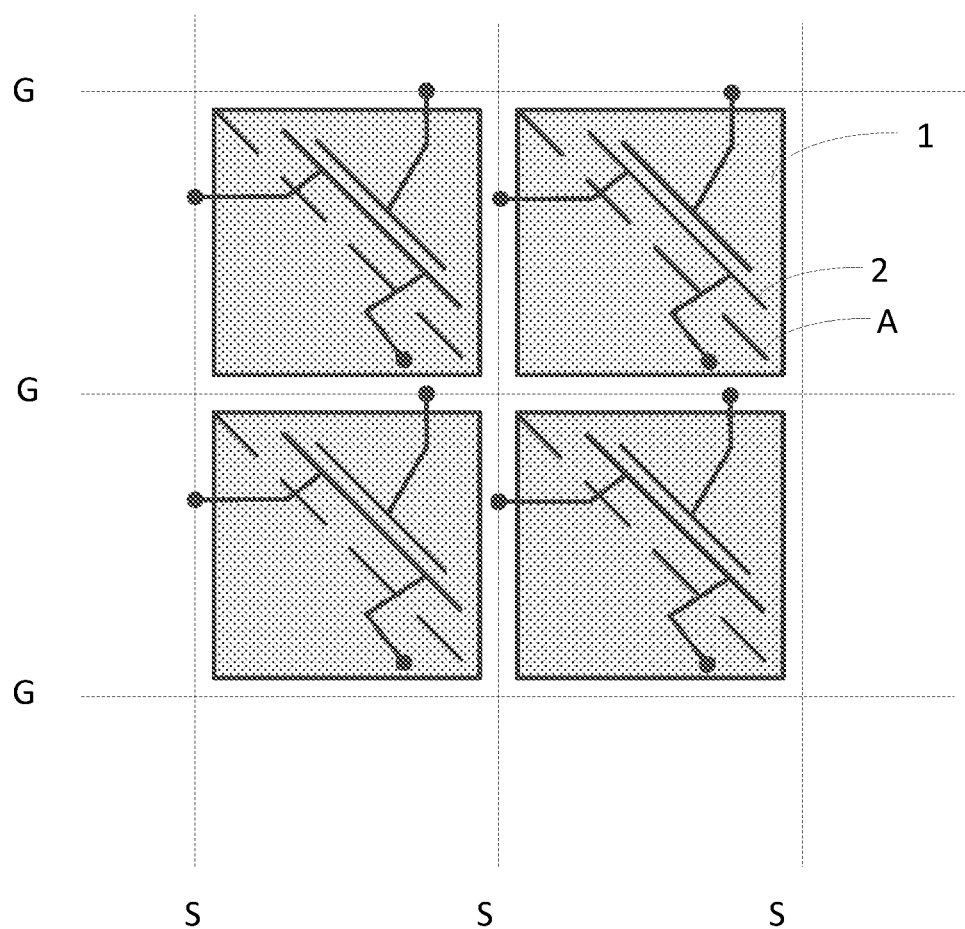
FIG. 3 is another structural schematic diagram of a relative position of a drive transistor in a pixel region provided in an embodiment of the present disclosure.

Optionally, in the array substrate provided in an embodiment of the present disclosure, as shown in FIG. 3, when the pixel region is a quadrangle, the first extension direction of the first active layer pattern 2 can be the same as the direction of the diagonal A of the pixel region; and the distance between the first active layer pattern 2 and the diagonal A satisfies a preset threshold.

Specifically, in the array substrate provided in an embodiment of the present disclosure, the extension direction of the active layer pattern can be in parallel with the extension direction of the diagonal of the pixel region, in addition, the distance between the active layer pattern and the diagonal of the pixel region should also satisfy a preset threshold, to ensure that the length of the active layer pattern when the extension direction of the active layer pattern is the same as the extension direction of the diagonal is larger than the length of the active layer pattern when the extension direction of the active layer pattern is in parallel with the gate line, wherein the preset threshold will be different according to different shapes of the pixel region, which will not be specifically defined herein.

Figure 4:
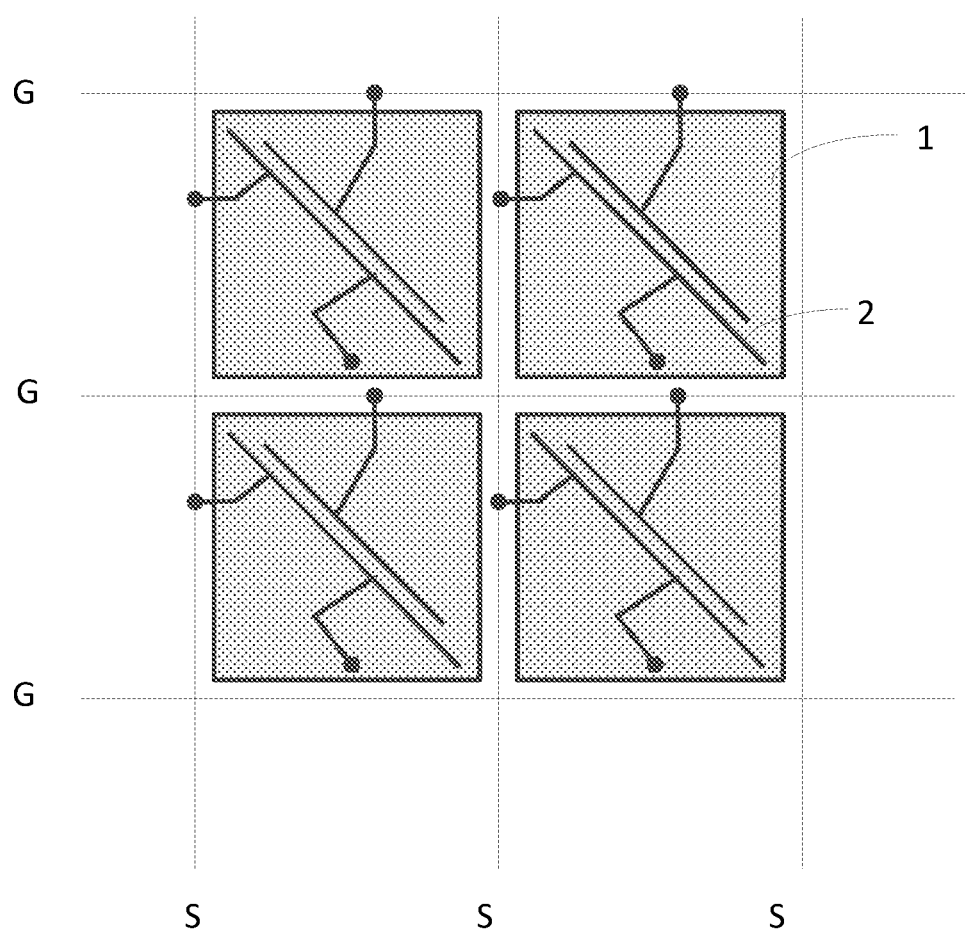
FIG. 4 is another structural schematic diagram of a relative position of a drive transistor in a pixel region provided in an embodiment of the present disclosure.

Optionally, as shown in FIG. 4, in the array substrate provided in an embodiment of the present disclosure, the first active layer pattern 2 extends along a direction of the diagonal A of the pixel region.

Specifically, in the array substrate provided in an embodiment of the present disclosure, when the first active layer pattern 2 extends along the direction of the diagonal A of the pixel region, the length of the first active layer pattern 2 in the pixel region can be the largest, i.e., the length-width ratio of the channel of the drive transistor is the largest, in this way, under the driving of a high voltage, the conduction characteristics of the drive transistor can be better ensured.

Optionally, in the array substrate provided in an embodiment of the present disclosure, the pixel region can be a rectangle, can also be the pattern of other shapes, and is selected according to actual use conditions.

Figure 5:
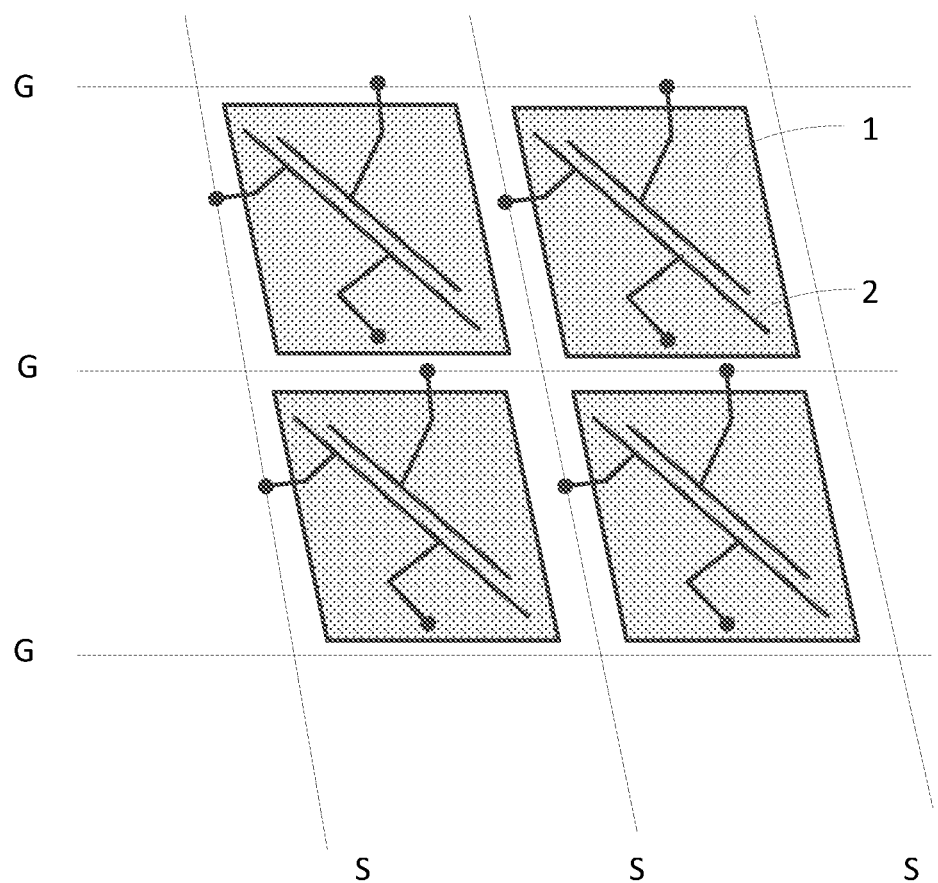
FIG. 5 is another structural schematic diagram of a relative position of a drive transistor in a pixel region provided in an embodiment of the present disclosure.

Optionally, as shown in FIG. 5, in the array substrate provided in an embodiment of the present disclosure, the pixel region can be a parallelogram, and the first active layer pattern 2 extends along the direction of a long diagonal of the parallelogram.

Specifically, in the array substrate provided in an embodiment of the present disclosure, when the shape of the pixel region is a parallelogram, the first active layer pattern 2 can extend along the direction of a diagonal of the parallelogram, to achieve the purpose of increasing the length of the first active layer pattern 2 in the extension direction. Preferably, the first active layer pattern 2 can extend along the direction of a long diagonal of the parallelogram, such that the length of the first active layer pattern 2 in the extension direction of the long diagonal can be the largest, thereby better improving the stability of the drive transistor under the driving of a high voltage.

Figure 6:
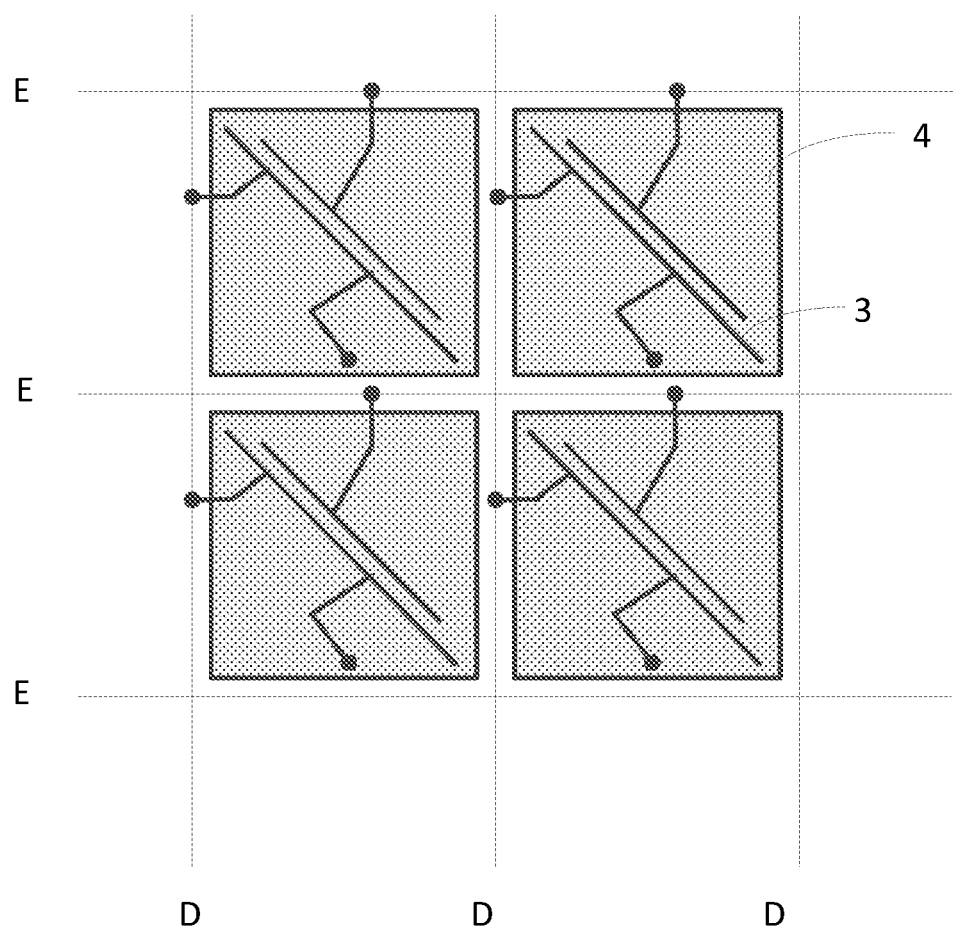
FIG. 6 is a structural schematic diagram of a relative position of an induction transistor in a pixel region provided in an embodiment of the present disclosure.

Optionally, as shown in FIG. 6, in the array substrate provided in an embodiment of the present disclosure, the array substrate further includes a plurality of induction transistors 3 arranged in the pixel region.

A second extension direction of a second active layer pattern of each induction transistor 3 forms a second preset angle with a gate line G adjacent to the each induction transistor, and in a second present angle direction, the second active layer pattern of the induction transistor 3 spans a pixel region corresponding to the each induction transistor in the inclined manner; and source and drain electrodes of the each induction transistor 3 are coupled with two ends, in the second preset angle direction, of the second active layer pattern.

Specifically, as shown in FIG. 6, in the array substrate provided in an embodiment of the present disclosure, the array substrate further includes a photosensitive device 4 arranged in the pixel region, which can be specifically realized through a PIN device. The photosensitive device 4 is electrically coupled with one of the source and drain electrodes of the induction transistor 3, and can be specifically coupled with the source of the induction transistor 3, the drain of the induction transistor 3 is coupled with the signal line D, and the gate of the induction transistor 3 can be coupled with the scanning line E.

Specifically, in the array substrate provided in an embodiment of the present disclosure, the induction transistor 3 of each pixel region provides the induction signal generated by the photosensitive device 4 in the pixel region to the corresponding signal line, to realize corresponding purpose. Wherein, through increasing the length-width ratio of the induction transistor 3, the generation of leakage current can be avoided, such that the transmission of induction signals is more accurate. The setting manner of the active layer pattern of the induction transistor 3 is similar to the setting manner of the drive transistor in the pixel region, can be implemented with reference to the positional relationship of the drive transistor in the pixel region, which is not repeated redundantly herein.

Optionally, in the array substrate provided in an embodiment of the present disclosure, the second extension direction of the second active layer pattern of the each induction transistor 3 is in parallel with the first extension direction of the first active layer pattern 2 of the drive transistor.

Specifically, in the array substrate provided in the embodiment of the present disclosure, the second active layer pattern of the induction transistor 3 can be set to be in the same layer as the first active layer pattern 2 of the drive transistor, at this time, a first orthographic projection of the first active layer pattern on the substrate and a second orthographic projection of the second active layer pattern on the substrate should not overlap with each other. Or, the second active layer pattern of the induction transistor 3 and the first active layer pattern of the drive transistor can also be arranged in different layers. When the second active layer pattern of the induction transistor 3 and the first active layer pattern 2 of the drive transistor are arranged in different layers, the second active layer pattern of the induction transistor 3 and the first active layer pattern of the drive transistor can be both arranged at the position of the long diagonal of the pixel region, and can also be arranged at other position of the pixel region, which is not specifically defined herein.

To simplify the preparation process, the second active layer pattern of the induction transistor 3 can be set to be in the same layer as the first active layer pattern of the drive transistor, when the second active layer pattern of the induction transistor 3 can be set to be in the same layer as the first active layer pattern of the drive transistor, the length of the second active layer pattern of the induction transistor 3 is smaller than the length of the first active layer pattern of the drive transistor. That is, the conduction stability of the drive transistor should be ensured first, to drive the drive electrode 1.

Figure 7:
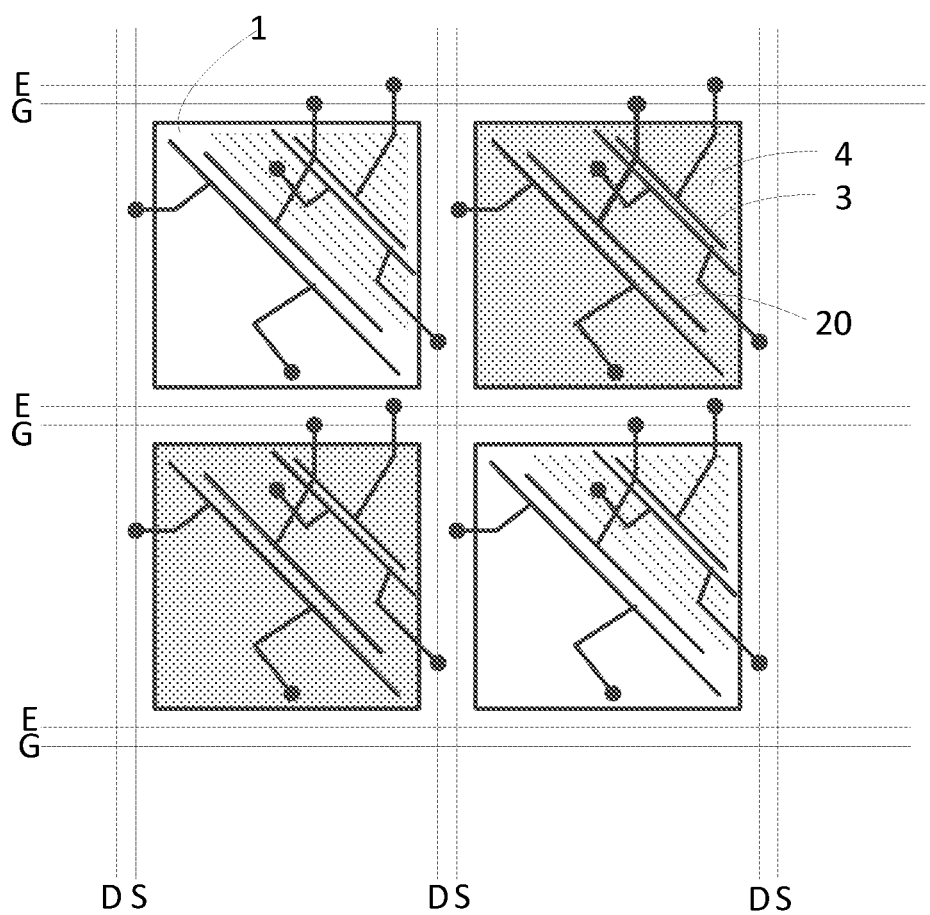
FIG. 7 is a structural schematic diagram of a relative position of a drive transistor and an induction transistor in a pixel region provided in an embodiment of the present disclosure.

Specifically, as shown in FIG. 7, in the array substrate provided in the embodiment of the present disclosure, the orthographic projections of the photosensitive device 4 and the drive transistor 20 on the substrate do not overlap with each other, thereby avoiding mutual interference between the electrical signals of the photosensitive device 4 and the drive transistor 20. The photosensitive device 4 utilizes the space not occupied by the drive transistor 20 in the pixel region, to realize the photosensitive function. Moreover, the induction transistor 3 coupled with the photosensitive device 4 can be arranged between the photosensitive device 4 and the substrate, i.e., beneath the photosensitive device 4, such that the layout of the pixel region is more compact.

Specifically, in the array substrate provided in an embodiment of the present disclosure, the drive electrode arranged in the pixel region can be a transparent drive electrode, and the transparent drive electrode is electrically coupled with one of the source and drain electrodes of the drive transistor 20; the transparent drive electrode can be arranged on a side, deviating from the substrate, of the photosensitive device 4, and the orthographic projection on the substrate covers the photosensitive device 4, i.e., the transparent drive electrode is arranged on the uppermost film layer of the photosensitive device 4 and the drive transistor 20.

Based on the same inventive concept, an embodiment of the present disclosure further provides a micro total analysis device, including the array substrate provided in any of the above embodiments.

Figure 8:
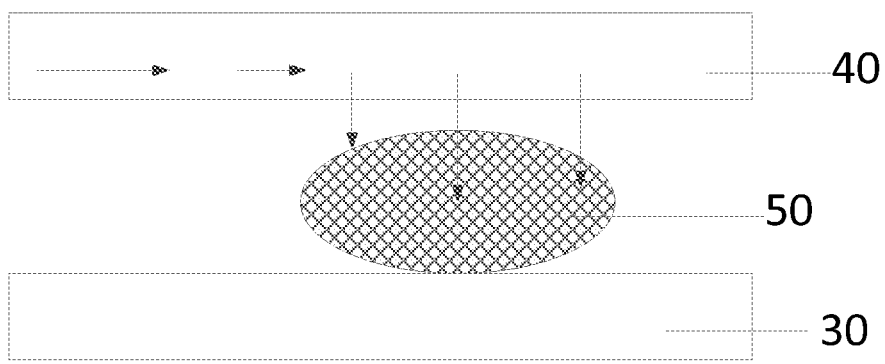
FIG. 8 is a structural schematic diagram of a micro total analysis device provided in an embodiment of the present disclosure.

Specifically, as shown in FIG. 8, in the micro total analysis device provided in an embodiment of the present disclosure, an optical waveguide 40 arranged opposite to the array substrate 30 is further included, and a space for accommodating to-be-analyzed objects 50 is arranged between the array substrate 30 and the optical waveguide 40.

Specifically, in the micro total analysis device provided in an embodiment of the present disclosure, the micro total analysis device can control movement, separation, polymerization, chemical reaction and biological detection of tiny droplets, each drive electrode moves the droplets to a designated position, the light source passes through the optical waveguide to separate vertical light of different wavelengths, and the vertical light is emitted from a designated position, and the photosensitive device (which can be a photosensitive diode coupled with the induction transistor) judges the position and component of droplets through detecting the light which passes through the droplets, wherein the specific working principles of the micro total analysis device are the same as those of the micro total analysis system or device in the related art, which is not repeated redundantly herein.

The embodiment of the present disclosure provides an array substrate and a micro total analysis device, wherein the array substrate includes: a substrate, a plurality of pixel regions arranged on the substrate and defined by the intersection of a data line and a gate line, and a drive transistor arranged in the pixel region; the drive transistor includes an active layer pattern, an extension direction of the active layer pattern forms a first preset angle with the gate line, and in a first preset angle direction, the active layer pattern spans the pixel region in an inclined manner; and the source and drain electrodes of the drive transistor are coupled with the active layer pattern in the first preset angle direction. The extension direction of the active layer pattern is set to form a first preset angle with the gate line, compared with the manner in which the extension direction of the active layer is set to be in parallel with the gate line, the length of the active layer pattern in the extension direction can be increased, therefore, not only the length-width ratio of the active layer pattern is increased, but also the area occupied in the pixel region is not increased, thereby being beneficial for realizing high pixel design while increasing the conduction characteristics of the drive transistor.

Evidently those skilled in the art can make various modifications and variations to the present disclosure without departing from the spirit and scope of the present disclosure. Thus the present disclosure is also intended to encompass these modifications and variations thereto so long as the modifications and variations come into the scope of the claims appended to the present disclosure and their equivalents.

The invention claimed is:

1. An array substrate, comprising:
a substrate;
a plurality of data lines and a plurality of gate lines, arranged on the substrate and intersected to define a plurality of pixel regions;
a plurality of drive transistors, arranged in the plurality of pixel regions respectively; and
a plurality of induction transistors arranged in the plurality of pixel regions respectively;
wherein each drive transistor comprises a first active layer pattern, a first extension direction of the first active layer pattern forms a first preset angle with a gate line adjacent to the each drive transistor, and in a first preset angle direction, the first active layer pattern spans a pixel region corresponding to the each drive transistor in an inclined manner; and source and drain electrodes of the each drive transistor are coupled with two ends, in the first preset angle direction, of the first active layer pattern;
a second extension direction of a second active layer pattern of each induction transistor forms a second preset angle with a gate line adjacent to the each induction transistor, and in a second preset angle direction, the second active layer pattern of the each induction transistor spans a pixel region corresponding to the each induction transistor in the inclined manner; and source and drain electrodes of the each induction transistor are coupled with two ends, in the second preset angle direction, of the second active layer pattern.

2. The array substrate of claim 1, wherein the pixel region is a quadrangle, and the first extension direction of the first active layer pattern is the same as a diagonal direction of the pixel region; and
a distance between the first active layer pattern and the diagonal satisfies a preset threshold.

3. The array substrate of claim 2, wherein the first active layer pattern extends along the diagonal direction of the pixel region.

4. The array substrate of claim 3, wherein the pixel region is a rectangle.

5. The array substrate of claim 3, wherein the pixel region is a parallelogram, and the first active layer pattern extends along a long diagonal direction of the parallelogram.

6. The array substrate of claim 1, wherein the second extension direction of the second active layer pattern of the each induction transistor is in parallel with the first extension direction of the first active layer pattern of the each drive transistor, and a first orthographic projection of the first active layer pattern on the substrate and a second orthographic projection of the second active layer pattern on the substrate do not overlap with each other.

7. The array substrate of claim 1, wherein a second length of the second active layer pattern of the each induction transistor is smaller than a first length of the first active layer pattern of the each drive transistor.

8. The array substrate of claim 1, further comprising a photosensitive device arranged in the pixel region, wherein the photosensitive device is electrically coupled with one of the source and drain electrodes of the each induction transistor; and
a third orthographic projection of the photosensitive device on the substrate and a fourth orthographic projection of the each drive transistor on the substrate do not overlap with each other.

9. The array substrate of claim 8, further comprising: a transparent drive electrode arranged in the pixel region, and the transparent drive electrode is electrically coupled with one of the source and drain electrodes of the each drive transistor; and the transparent drive electrode is arranged on a side, deviating from the substrate, of the photosensitive device, and a fifth orthographic projection of the transparent drive electrode on the substrate covers the third orthographic projection of the photosensitive device on the substrate.

10. A micro total analysis device, comprising the array substrate according to claim 1.

11. The micro total analysis device of claim 10, further comprising: an optical waveguide arranged opposite to the array substrate, wherein a space for accommodating to-be-analyzed objects is arranged between the array substrate and the optical waveguide.

\* \* \* \* \*